(12) United States Patent
Fornara et al.

(10) Patent No.: US 9,324,706 B2
(45) Date of Patent: Apr. 26, 2016

(54) METHOD OF MAKING AN INTEGRATED SWITCHABLE CAPACITIVE DEVICE

(71) Applicant: STMicroelectronics (Rousset) SAS, Rousset (FR)

(72) Inventors: Pascal Fornara, Pourrières (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/957,544

(22) Filed: Dec. 2, 2015

(65) Prior Publication Data

US 2016/0093609 A1 Mar. 31, 2016

Related U.S. Application Data

(62) Division of application No. 14/264,227, filed on Apr. 29, 2014, now Pat. No. 9,230,907.

(30) Foreign Application Priority Data

Apr. 30, 2013 (FR) ..................................... 13 53945

(51) Int. Cl.
*H01L 21/02* (2006.01)
*H01L 27/06* (2006.01)
*H01L 23/482* (2006.01)
(Continued)

(52) U.S. Cl.
CPC ........ *H01L 27/0629* (2013.01); *H01L 21/7682* (2013.01); *H01L 21/7687* (2013.01); *H01L 23/4821* (2013.01); *H01L 23/5223* (2013.01); *H01L 28/60* (2013.01); *H01L 23/642* (2013.01); *H01L 2924/1461* (2013.01)

(58) Field of Classification Search
CPC ..................... H01L 2924/1461; H01L 23/642; H01L 23/5223; H01L 21/7681
See application file for complete search history.

(56) References Cited

U.S. PATENT DOCUMENTS 5,880,921 A 3/1999 Tham et al.
6,377,438 B1 4/2002 Deane et al.
(Continued)

FOREIGN PATENT DOCUMENTS

FR 3000841 7/2014
KR 20110066395 A 6/2011

OTHER PUBLICATIONS

Dereus, D.R. et al., "Tunable Capacitor Series/Shunt Design for Integrated Tunable Wireless Front End Applications," MEMS 2011, Cancun, Mexico, Jan. 23-27, 2011, 4 pages.

(Continued)

*Primary Examiner* — Nicholas Tobergte
(74) *Attorney, Agent, or Firm* — Slater & Matsil, L.L.P.

(57) ABSTRACT

A method is provided for forming an integrated circuit chip with a variable capacitor disposed in a metallization. A back end of line metallization is formed over the semiconductor substrate. The variable capacitor is formed within a cavity of the back end of line metallization. The variable capacitor includes a fixed main capacitor electrode disposed in a first metal layer of the back end of line metallization, a second main capacitor electrode electrically connected to a second metal layer of the back end of line metallization and vertically spaced from the fixed main capacitor electrode, and a movable capacitor electrode disposed in the first metal layer adjacent the fixed main capacitor electrode.

20 Claims, 16 Drawing Sheets

(51) Int. Cl.
*H01L 23/522* (2006.01)
*H01L 21/768* (2006.01)
*H01L 49/02* (2006.01)
*H01L 23/64* (2006.01)

(56) References Cited

U.S. PATENT DOCUMENTS

| | | | |
|---|---|---|---|
| 7,265,019 B2* | 9/2007 | Chinthakindi | H01G 5/38 438/381 |
| 7,657,995 B2 | 2/2010 | Hsu et al. | |
| 8,604,898 B2 | 12/2013 | Anderson et al. | |
| 8,609,450 B2* | 12/2013 | Gambino | B81C 1/00293 438/48 |
| 8,829,626 B2* | 9/2014 | Gambino | H01H 59/0009 257/414 |
| 8,861,218 B2* | 10/2014 | Smith | B81B 7/04 361/760 |
| 9,006,897 B2 | 4/2015 | Di-Giacomo | |
| 9,056,760 B2* | 6/2015 | Feiertag | B81C 1/00238 |
| 2004/0214543 A1* | 10/2004 | Osone | H01G 5/16 455/197.2 |
| 2006/0267558 A1* | 11/2006 | Petz | H01G 5/18 320/166 |
| 2006/0285255 A1 | 12/2006 | Kawakubo et al. | |
| 2007/0183116 A1 | 8/2007 | Combi et al. | |
| 2007/0222007 A1* | 9/2007 | Van Beek | B81B 3/0078 257/415 |
| 2010/0116632 A1 | 5/2010 | Smith et al. | |
| 2011/0051309 A1 | 3/2011 | Furukawa et al. | |
| 2011/0063773 A1 | 3/2011 | Ikehashi | |
| 2012/0138436 A1* | 6/2012 | Gambino | H01H 59/0009 200/181 |
| 2013/0147004 A1 | 6/2013 | Rivero et al. | |
| 2014/0209442 A1* | 7/2014 | Gambino | H01H 59/0009 200/181 |
| 2015/0203349 A1 | 7/2015 | Di-Diacomo | |

OTHER PUBLICATIONS

Kaynak, M. et al., "Characterization of an Embedded RF-MEMS Switch," Date of Conference Jan. 11-13, 2010, 4 pages.

* cited by examiner

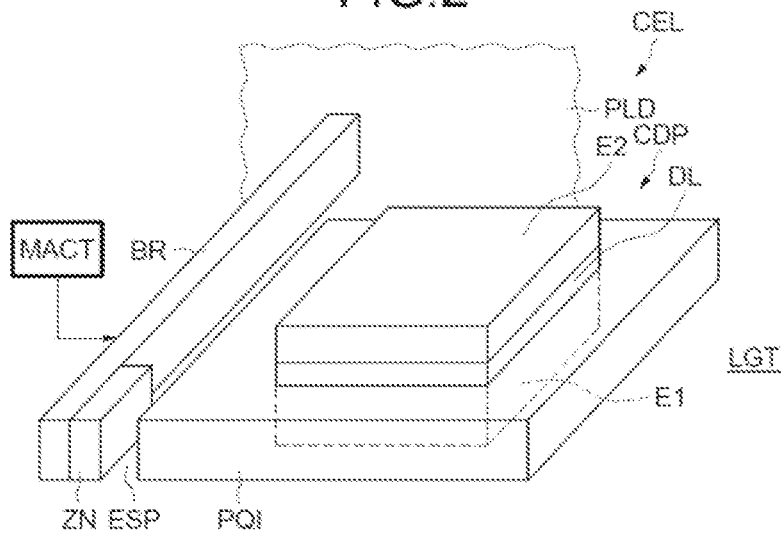
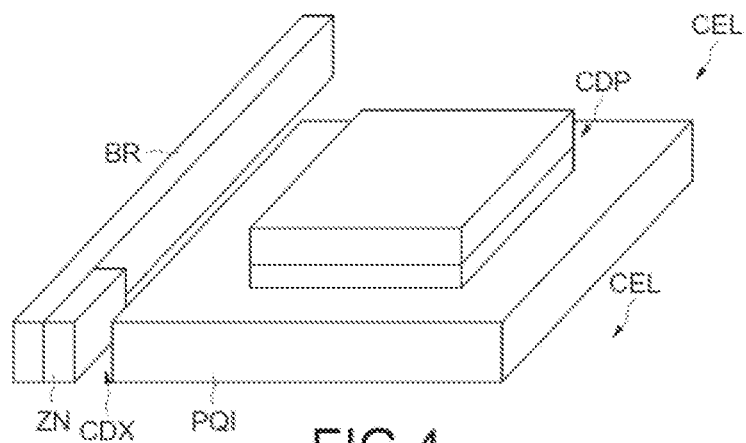
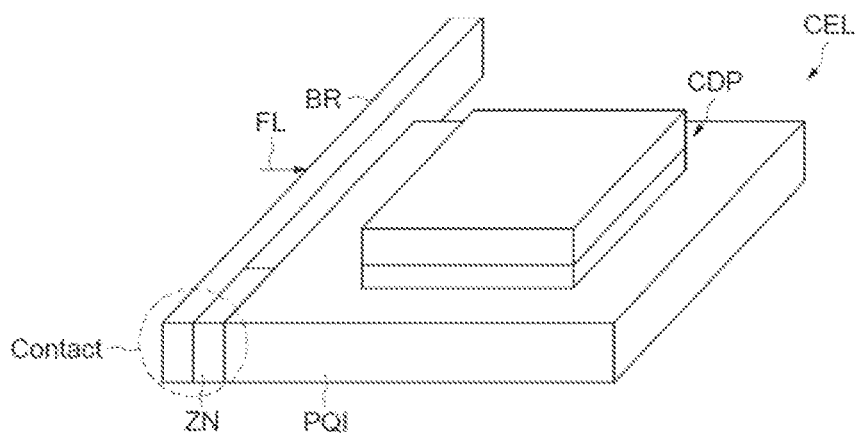

METHOD OF MAKING AN INTEGRATED SWITCHABLE CAPACITIVE DEVICE

This is a divisional of U.S. patent application Ser. No. 14/264,227, filed on Apr. 29, 2014, which claims the benefit of French Application No. 1353945, filed on Apr. 30, 2013, which applications are hereby incorporated herein by reference.

TECHNICAL FIELD

The invention relates to integrated circuits and, more particularly, the fabrication of switchable capacitive devices.

BACKGROUND

Currently, within integrated circuits, there exist controllable capacitive devices in the form of micro-electro-mechanical systems (or MEMS). In this regard, the article by DeReus et al. may be cited. This article is entitled "Tunable capacitor series/shunt design for integrated tunable wireless front end applications," MEMS 2011, Cancun, Mexico, 23-27 Jan. 2011, 2011 IEEE.

The capacitive device described in this article is based on a structure of the suspended bridge type comprising a metal membrane disposed at a distance from a lower electrode underneath a dielectric layer. When the membrane is at a distance from the dielectric layer, the capacitive device exhibits a first capacitive value, which is typically low. Whereas, when the membrane is actuated in such a manner as to come into contact with the dielectric layer, the metal membrane/dielectric layer/lower electrode assembly forms a capacitor having a second capacitive value, which is typically high.

The control of the flexing of the metal membrane is carried out by applying a high voltage, typically of around 50 volts, in such a manner as to provide both a correct flexing of the mobile electrode and to ensure a correct contact with the dielectric layer.

Quite apart from the fact that the technology used to fabricate such devices is a dedicated technology which is difficult to integrate into a standard CMOS process line, the necessity of applying a high voltage, of the order of several tens of volts, is a major drawback. Furthermore, the dielectric layer of the capacitor is, by construction, subjected to high stresses because the mobile electrode hits against the dielectric layer during each movement.

SUMMARY

According to one embodiment, a switchable capacitive device is provided disposed, at least in part, within the interconnection part (commonly denoted by those skilled in the art under the acronym BEOL for Back End Of Lines) and which may be fabricated by all CMOS process lines by the potential addition of only a few additional operations (the addition of one mask level for example), and without using the conventional technology of the MEMS type.

According to one embodiment, a switchable capacitive device is provided that does not require an activation high voltage for switching the capacitive device from one configuration to another, and that does not have a dielectric layer stressed by a mobile electrode.

According to one embodiment, a simple integration of such a switchable capacitive device is provided owing notably to a lateral movement of a flexible arm in one plane, not requiring, in such a configuration, any movement in a direction orthogonal to the plane.

According to one embodiment, the use of a capacitor of the MIM (Metal Insulator Metal) type is thus provided that is designed to be electrically connected or otherwise to a mobile metal arm that may be actuated for example electrostatically. Thus, when the arm is in contact with the MIM capacitor, the capacitive value of the capacitive device is the capacitive value of the MIM capacitor. On the other hand, when the metal arm is not in contact with the MIM capacitor, the resulting capacitive structure is composed of two capacitors in series, namely the MIM capacitor and the capacitor defined by the layer of air between the arm and a fixed body connected to an electrode of the capacitor or else a part of this electrode.

According to a more general aspect, an integrated circuit is provided comprising, on top of a substrate, an interconnection part (BEOL) comprising several metallization levels separated by an insulating region, commonly denoted by those skilled in the art under the acronym IMD (Inter-Metal Dielectric).

According to a general feature of this aspect, the integrated circuit comprises at least one switchable capacitive device having an adjustable capacitive value and comprising at least one switchable capacitive cell.

This switchable capacitive cell has a main capacitor, for example of the MIM type, and a metal system disposed, at least in part, in an accommodation of the interconnection part, the metal system being electrically connected to the main capacitor.

The metal system comprises first and second metal elements, being mobile relative to one another within the accommodation, and the metal system is switchable between a first configuration in which the two elements are mutually spaced out in such a manner as to form an auxiliary capacitor electrically connected to the main capacitor and to thus give a first capacitive value to the capacitive cell, and a second configuration in which the two metal elements are in mutual contact in such a manner as to give a second capacitive value to the capacitive cell.

Although not required, the two metal elements are advantageously situated within the same metallization level, which thus allows an extremely simple implementation and a lateral movement of the two mobile elements relative to one another, in the same horizontal plane.

Several variant embodiments are possible for the metal system and for the disposition of the main capacitor with respect to the metal system.

Thus, according to one embodiment, the first metal element comprises at least one region of a metal arm being mobile within the accommodation and able to be actuated.

This mobile metal arm in the accommodation can be rigidly attached to a wall of the accommodation, either directly or indirectly by means of pins in such a manner as to form for example an assembly in the shape of a cross.

The metal arm mobile within the accommodation may also pass through a wall of the accommodation via an opening so as to be rigidly attached to a metallization of the interconnection part situated outside of the accommodation.

The second metal element can comprise a fixed metal body. This fixed body may be connected to a first electrode of the main capacitor or else be formed directly by at least a part of the first electrode. Furthermore, this fixed metal body is disposed in the first configuration facing and at a distance from the region of the mobile arm.

According to a first variant, the main capacitor, for example a metal/dielectric/metal capacitor (MIM capacitor), is situated within the accommodation and can comprise a first electrode connected to the second metal element or at least a part of which forms the second metal element.

In this case, the first electrode and the two metal elements are advantageously situated within the same metallization level, a fact which further facilitates the integration of the device.

According to another variant, the main capacitor, for example a metal/dielectric/metal capacitor, is situated outside of the accommodation, for example within the interconnection part (BEOL), and then comprises a first electrode connected to the second metal element via a metallization passing through an opening formed in a wall of the accommodation.

In the case where at least one wall of the accommodation comprises an opening through which, at a distance from the edges of the opening, a metallization passes that comes into contact with a part of the capacitive device situated inside of the accommodation, it is particularly advantageous, but not indispensable, notably in order to reduce the risk of degradation of the external environment of the accommodation, for the integrated circuit to furthermore comprise an element, for example a metal plate, external to the accommodation, configured so as to form an obstacle to the diffusion of fluid out of the accommodation through the opening, typically when the capacitive device encapsulated within the accommodation is de-encapsulated. Moreover, the metallization then passes through the external element.

Although the metal system comprising the two elements can be switchable in various ways, for example thermally, it is particularly advantageous for the capacitive cell to furthermore comprise an actuator configured for generating an electrostatic field between the two metal elements, the metal system being designed to be in one of the configurations in the absence of an electrostatic field and in the other configuration in the presence of the electrostatic field.

Such an electrostatic actuation has a particularly low power consumption and does not require the application of a high voltage. This is therefore particularly compatible with advanced CMOS technologies whose supply voltages are low, typically of the order of a few volts.

By way of example, the actuator can comprise an electrically conducting actuation element, for example a metal plate, disposed facing the metal arm, and a generation element configured for applying a first supply voltage to the metal arm, for example ground potential, and a second supply voltage to the actuation element, for example a positive voltage.

Various embodiments are possible for the first metal element of the cell, and various dispositions of the main capacitor, of the actuation element and of the fixed body relative to each other are possible.

Thus, by way of example, the first element of the cell can be in the shape of a cross and comprise a beam held so as to pivot by at least two pins rigidly attached to walls of the accommodation. The beam defines two mobile arms on either side of the pivot point. The beam and the pins are made of metal and situated within the same metallization level.

The actuation element can be situated facing one of the arms and the fixed body facing the other arm, the actuation element and the fixed body being respectively situated on either side of the beam.

The main capacitor and the fixed body can be situated facing the same arm.

According to one embodiment, the switchable capacitive device may comprise several capacitive cells, the metal systems of these cells being individually switchable.

This allows a capacitive device to be formed capable of taking a capacitive value chosen from amongst a predetermined set of capacitive values, which is particularly advantageous, in particular in wireless communications applications, in order to be able to tune to different bands of frequencies and/or for switched-capacitance filters.

BRIEF DESCRIPTION OF THE DRAWINGS

Other advantages and features of the invention will become apparent upon examining the detailed description of non-limiting embodiments, and of the appended drawings in which:

FIGS. 1 to 24 relate to various embodiments and variants of the invention.

DETAILED DESCRIPTION OF ILLUSTRATIVE EMBODIMENTS

Figure 1:
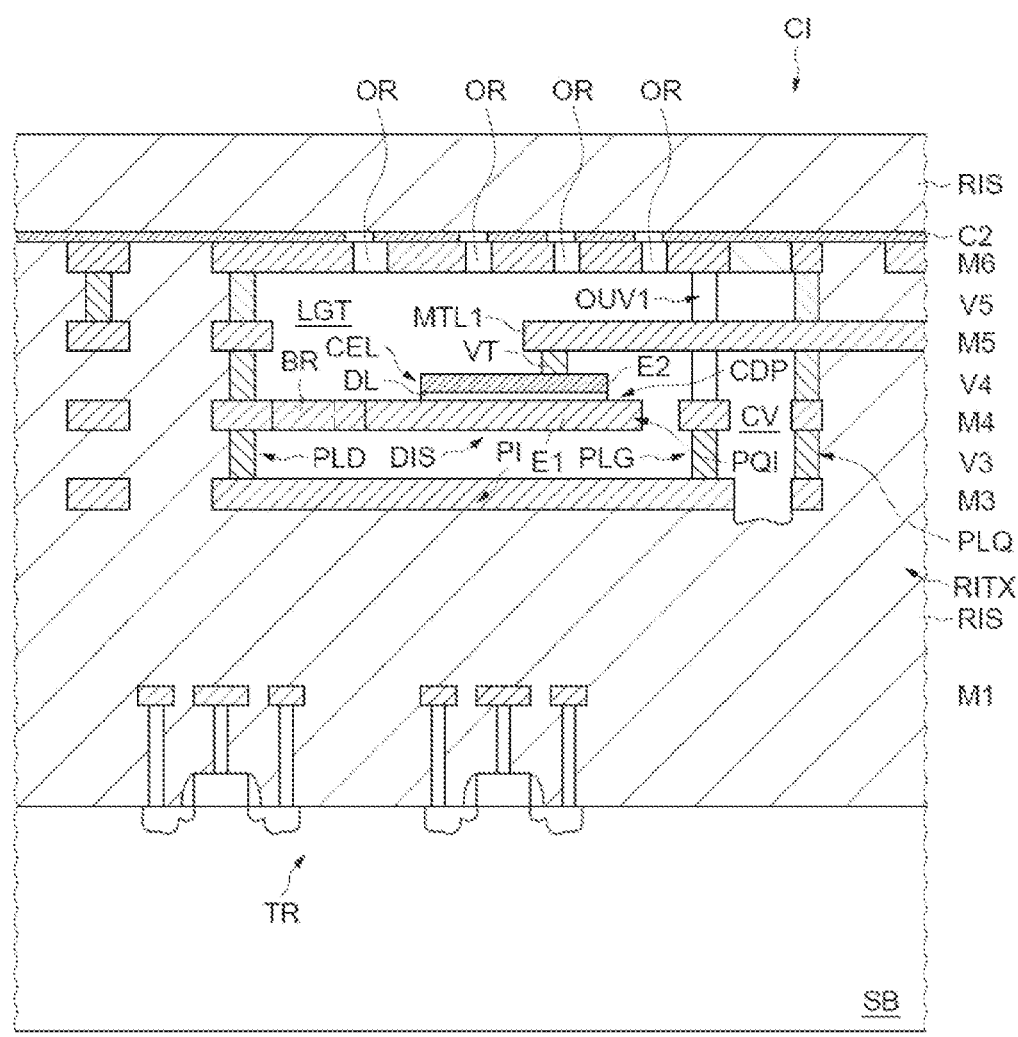

In FIG. 1, the reference CI denotes an integrated circuit within which a switchable capacitive device is situated. The capacitive device has an adjustable capacitive value and comprises at least one switchable capacitive cell CEL. The cell CEL is accommodated, at least partially, within an accommodation LGT.

As will be seen in more detail hereinafter, the cell CEL and the accommodation LGT are formed within several metallization levels (here four metallization levels M3, M4, M5, M6) and several (here three) via levels (V3, V4, V5) of the interconnection part RITX of the integrated circuit CI. This interconnection part is commonly denoted by those skilled in the art under the acronym BEOL ("Back End Of Lines").

This interconnection part is located on top of the substrate SB of the integrated circuit and on top of the components, such as the transistors TR formed within and on the substrate SB.

As is conventional in this field, the metal tracks formed within the various metallization levels of the integrated circuit are, for certain of them, mutually connected via interconnection holes or vias, all of these tracks and vias being encapsulated within an insulating region RIS which can be formed from one or more electrically insulating materials.

In FIG. 1, the accommodation LGT comprises a lower part having a bottom wall PI at the metal level M3, a side wall PLD formed at the via levels V3, V4 and V5 and also at the metal levels M4 and M5. The accommodation LGT also comprises a wall PLG formed at the level of vias V3, V4 and V5 and also at the metal levels M4 and M5. This wall PLG comprises an opening OUV1 through which a metallization MTL1, formed at the metal level M5, passes.

The accommodation LGT is closed by a cover with holes CPT comprising several orifices OR. Here, the cover CPT is formed at the metal level M6. The cover CPT is, in this example, covered by a layer C2, for example of silicon nitride or an oxide of silicon, aimed at partially blocking the orifices OR. The layer C2 is covered with a layer of oxide RIS in such a manner as to close the orifices OR and to allow the subsequent formation of the various higher via and metallization levels. However, if the last metallization level is reached, the upper layer RIS is replaced by a conventional passivation layer.

The capacitive cell CEL comprises a main capacitor CDP comprising a metal lower electrode E1, formed at the metal level M4, and a metal upper electrode E2 formed between the metal levels M4 and M5. A dielectric layer DL, for example of silicon dioxide, of silicon nitride, or another material, is situated between the two electrodes E1 and E2.

In the example, shown schematically in FIG. 1, the lower electrode E1 forms part of a lower metal plate PQI. The cell CEL also comprises, in this example, a mobile arm BR designed to come, as will be seen in more detail hereinafter, into contact or otherwise with the lower plate PQI and hence into contact or otherwise with the lower electrode E1 of the capacitor CDP.

The metallization MTL1 comes into contact, by means of a specific via VT, with the upper electrode E2 of the capacitor CDP.

As will be explained in more detail hereinafter, during the fabrication of the device, the elements contained within the accommodation LGT are encapsulated within an insulating material. Then, the whole assembly is de-encapsulated by circulation of a fluid through the orifices OR. In this example, the capacitor CDP, accommodated within the accommodation LGT thus hollowed out, is held by virtue of the metallization M5 and of the via VT. With regard to the arm BR, in this example, this is rigidly attached to the wall PLD of the accommodation.

On the other hand, when the de-encapsulation fluid flows within the accommodation LGT filled with insulating material, the latter can escape through the opening OUV1 and damage the external environment of the accommodation. Accordingly, although not absolutely indispensable, an element PLQ, here a metal plate formed at the metal levels M3, M4, M5, M6 and at the via levels V3, V4 and V5, is advantageously provided external to the accommodation LGT and configured so as to form an obstacle to the diffusion of fluid out of the accommodation through the opening OUV1. The metallization M5 penetrates into the accommodation LGT through the opening OUV1 and, as will be seen in more detail hereinafter, at a distance from the edges of the opening OUV1 in such a manner as to avoid a short-circuit with the wall PLG, so as to come into contact, in this example, with the second electrode E2 of the capacitor CDP.

The metallization M5 furthermore passes through the wall PLQ.

The diffusion of the de-encapsulation fluid is therefore reduced so as to form for example a cavity CV of limited size within the insulating material RIS.

Reference is now more particularly made to FIGS. 2 to 4, which are essentially schematic, in order to describe the general principle of operation of the device in relation to one embodiment.

More precisely, in FIG. 2, a first element of a configurable metal system is an arm BR rigidly attached to a wall, for example the wall PLD of the accommodation, and mobile within the accommodation LGT. The arm BR comprises a region ZN which is situated at a distance from the corresponding region (here forming a second metal element of the system) of the lower plate PQI incorporating the lower electrode E1 of the capacitor CDP.

The region ZN of the arm BR therefore forms, with the corresponding region of the plate PQI, a gap ESP.

Furthermore, actuator MACT is provided in order to allow the arm BR to go from the configuration illustrated in FIG. 3 to the configuration illustrated in FIG. 4.

As will be seen in more detail hereinafter, this actuator MACT can be an actuator of the electrostatic type.

In FIG. 3, corresponding to a first configuration of the metal system, the region ZN of the arm BR is at a distance from the corresponding region (forming a fixed body) of the plate PQI. For this reason, this region ZN of the arm BR, the corresponding facing region of the plate PQI, and the layer of air situated in the gap ESP form an auxiliary capacitor which, here, is connected in series with the main capacitor CDP.

For this reason, the capacitive value CEL of the cell has a first capacitive value in this first configuration.

More precisely, the inverse of this first capacitive value is equal to the sum of the inverse of the capacitive value of the auxiliary capacitor CDX and of the inverse of the capacitive value of the main capacitor CDP.

In the second configuration of the metal system, illustrated in FIG. 4, the arm BR has been moved according to the arrow FL by the actuator MACT in such a manner that the region ZN is in electrical contact with the corresponding region of the lower plate PQI. This therefore gives a second capacitive value to the cell CEL. More precisely, this second capacitive value is equal to that of the capacitor CDP.

It should be noted that, in this example, the arm BR (first metal element), the fixed body (second metal element) connected to the electrode E1 of the main capacitor (and here forming an integral part of the plate PQI), together with the first electrode of the capacitor CDP are fabricated within one and the same metallization level.

This greatly facilitates the integration within the BEOL part of the integrated circuit by using conventional CMOS process lines. This also leads to a lateral displacement of the arm with respect to the fixed body.

Furthermore, the fact that the arm BR comes into contact with a fixed body connected to the main capacitor CDP avoids it directly hitting against the dielectric layer DL of the capacitor CDP. Consequently, the latter is not subjected to any stress, and this is all the more true since the displacement is lateral.

However, although a lateral displacement, corresponding to the fabrication of all the elements within the same metallization level, is particularly advantageous, it is not out of the question to provide a vertical displacement of the arm so that it comes into contact for example with the lower part of the plate PQI, at the expense of a slightly more complex fabrication of the cell CEL.

Figure 5:
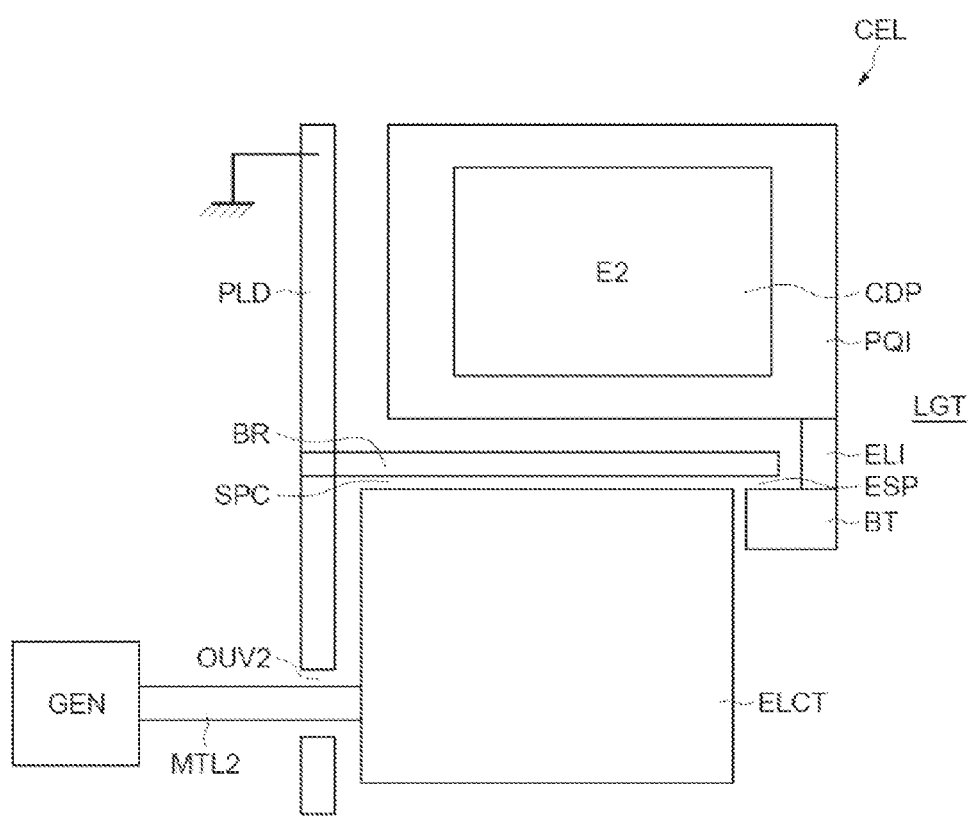

Reference is now more particularly made to FIG. 5, which is a partial top view of another embodiment of a capacitive cell CEL.

In this exemplary embodiment, the mobile arm BR is fixed onto the wall PLD, and it can accordingly be flexed. The second metal element here is formed of a fixed end-stop BT connected to the plate PQI and consequently to the lower electrode of the capacitor CDP by a metal connection element ELI. The plate PQI, the element ELI and the end-stop BT are formed within the same metallization level. The arm BR is also formed within this same metallization level.

Here, the actuator MACT is of the electrostatic type and comprises an actuation element ELCT here composed of a metal plate formed, in this example, here also in the same metallization level as the end-stop BT, the arm BR and the plate PQI of the capacitor CDP.

The actuation element is connected to a voltage generator GEN via a metallization MTL2 passing through the wall PLD of the accommodation LGT through an opening OUV2.

In this embodiment, the actuation element and the main capacitor CDP are both accommodated within the accommodation LGT and are disposed on either side of the metal arm BR. Furthermore, the fixed body BT and the actuation element are situated on the same side of the metal arm BR.

The metal arm BR is spaced from the actuation element ELCT by a gap SPC, whereas the end of the metal arm BR is separated from the end-stop BT by the gap ESP in such a manner as to form, in the first configuration, the auxiliary capacitor.

In the example described here, the wall PLD of the accommodation is set at ground potential, and when no voltage is applied to the actuation element ELCT, the mobile arm BR remains in the configuration illustrated in FIG. 5.

On the other hand, when the generation device GEN applies a voltage, for example a positive voltage, to the actuation element ELCT, an electrostatic field is then created in the gap SPC which will attract the mobile arm BR towards the actuation element ELCT and, consequently, will bring the end BR of this arm into contact with the end-stop BT in such a manner as to place the cell in its second configuration.

Figure 6:
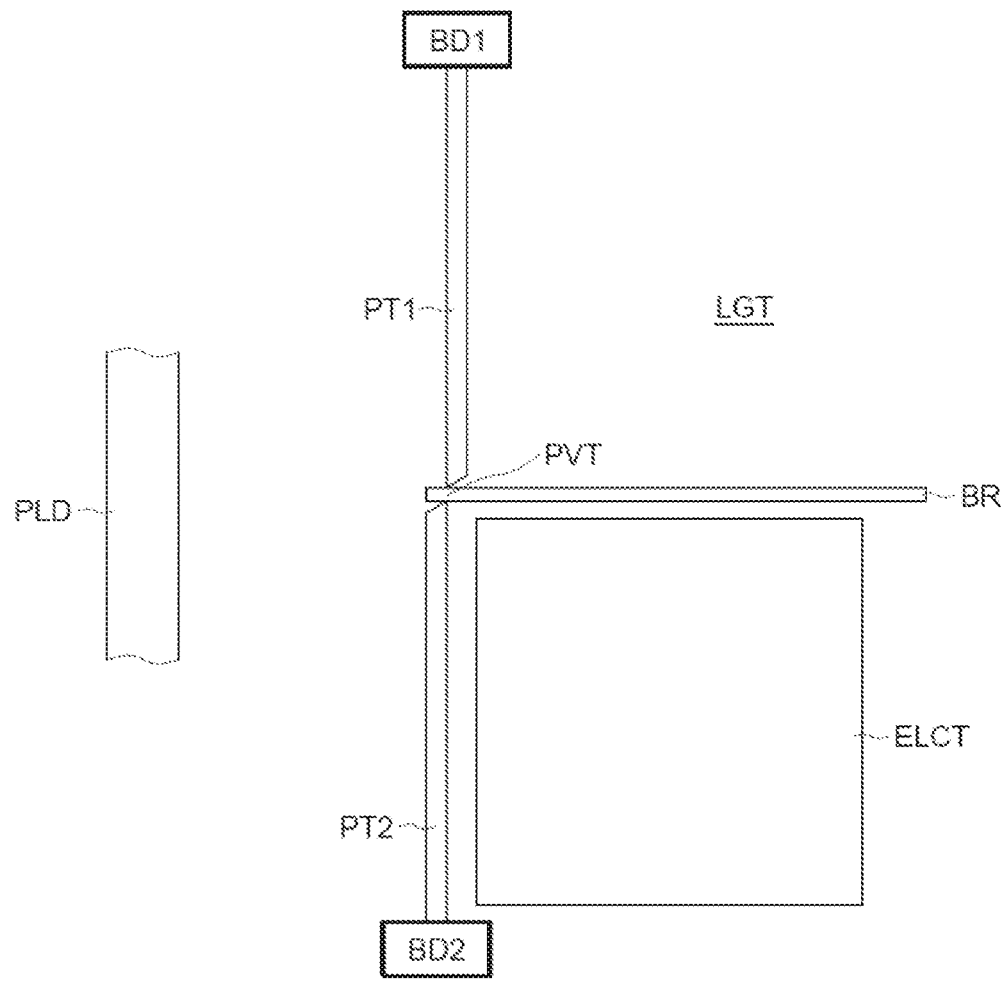

Whereas in the embodiment illustrated in FIG. 5, the arm BR was directly rigidly attached to the wall PLD, the first metal element EL1 of the cell, in the embodiment illustrated in FIG. 6, has the shape of a 'T' and comprises the arm BR held so as to pivot by two pins PT1, PT2 rigidly attached to walls BD1, BD2 of the accommodation LGT.

Furthermore, so as to promote the flexing of the arm BR when it is electrostatically actuated, it is advantageously designed for the ends of the pins PT1 and PT2 rigidly attached to the arm to define a pivot point PVT. For this purpose, the ends of the pins PT1 and PT2 may for example be beveled. The arm BR is therefore mobile about the pivot point PVT.

Here again, the element EL1 and the actuation element ELCT are advantageously formed within the same metallization level in such a manner as to obtain a lateral displacement of the arm in the plane containing this metallization level.

Figure 7:
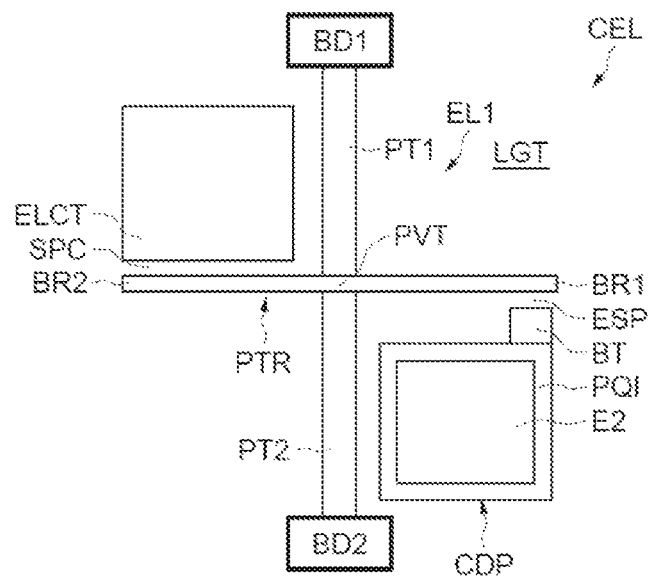

It is also possible, as illustrated in FIG. 7, for the first element EL1 of the cell CEL to have the shape of a cross and to comprise a beam PTR held, preferably so as to pivot, by two pins PT1, PT2 rigidly fixed to the walls BD1 and BD2 of the accommodation.

Thus, the beam PTR defines, on either side of the crossing point between the pins and the beam (preferably the pivot point), two mobile arms BR1 and BR2 on either side of this point PVT. The actuation element ELCT is then situated facing one of the arms, for example the arm BR2, whereas the fixed body BT is situated facing the other arm BR1.

Furthermore, the actuation element ELCT and the fixed body BT are respectively situated on either side of the beam PTR.

Moreover, in this embodiment, the capacitor CDP and the fixed body, here the end-stop BT, which is rigidly fixed to the plate PQI of the capacitor CDP, are situated facing the same arm BR1.

Figure 8:
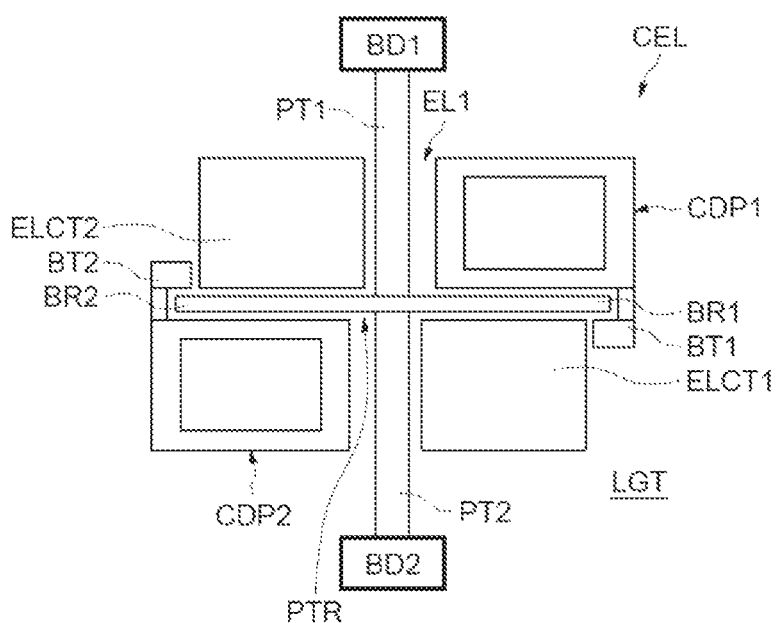

In the exemplary embodiment illustrated in FIG. 8, the element EL1 still takes the form of a cross but, this time, the second metal element of the cell comprises two fixed bodies (two end-stops) BT1 and BT2 rigidly connected to two main capacitors CDP1, CDP2. The two fixed metal bodies BT1 and BT2 are respectively situated on either side of the beam PTR and respectively facing the two arms BR1 and BR2. The two main capacitors CDP1 and CDP2 are furthermore respectively situated opposite two actuation elements ELCT1 and ELCT2 and, as can be seen, the two main capacitors are respectively connected to the two fixed bodies situated on the other side of the beam PTR.

In this embodiment, the capacitive value is divided between two main capacitors of the MIM type and the actuation is effected by two electrostatic actuation elements, which is a more efficient arrangement.

Figure 9:
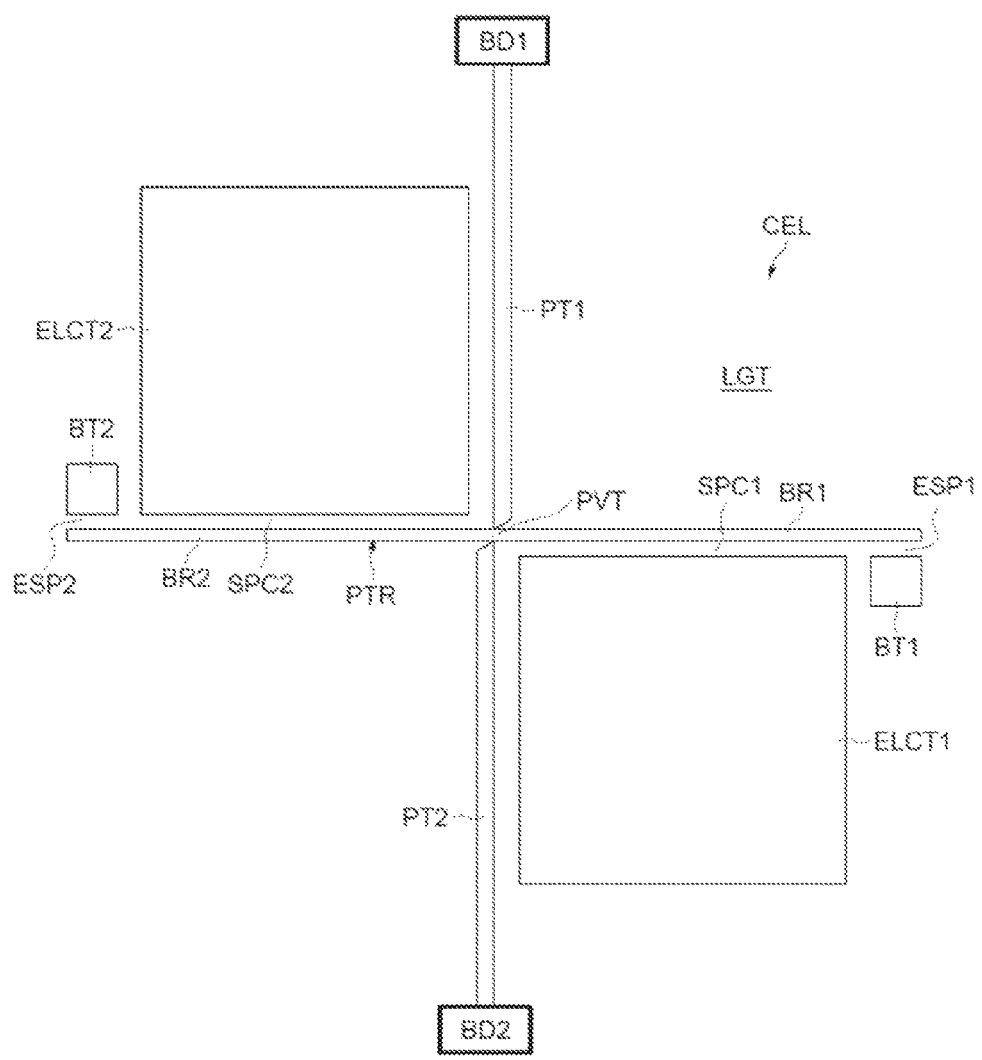

In this respect, as illustrated in FIG. 9, it is even more efficient, as previously indicated, to provide a pivot point PVT with, for example, pins PT1 and PT2 beveled at their attachment point to the beam PTR.

The actuation element ELCT1 of the cell CEL is then spaced from the arm BR1 by a gap SPC1, whereas the actuation element ELCT2 is spaced from the arm BR2 by a gap SPC2. Furthermore, the end of the arm BR1 is spaced from the end-stop BT1 by a gap ESP1, whereas the end of the arm BR2 is spaced from the end-stop BT2 by a gap ESP2. These two gaps ESP1, ESP2 are preferably identical. Similarly, the gaps SPC1 and SPC2 are preferably identical.

For the purposes of simplification, the two main capacitors CDP1 are not shown in this FIG. 9. Indeed, the latter may be accommodated within the cell within the diagonal different from that containing the actuation elements ELCT1 and ELCT2, as illustrated schematically in FIG. 8, or else accommodated outside of the accommodation, in another part of the interconnection part RITX (BEOL).

Figure 10:
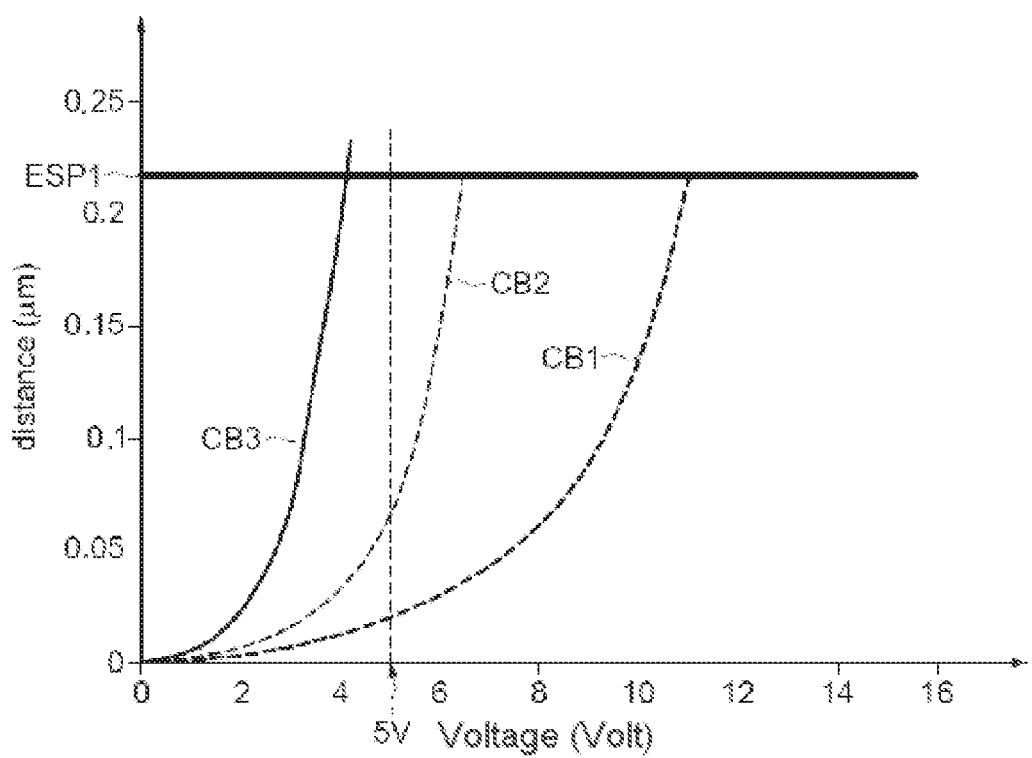

The FIG. 10 shows three curves illustrating, for the structure in FIG. 9, the change in the distance separating the actuation element from the corresponding arm as a function of the voltage applied to the actuation element. In the example described here, it is assumed that the gap ESP1 between the free end of the arm BR1 and the end-stop BT1 is for example equal to 0.22 microns. The curve CB1 corresponds to an arm BR1 (or BR2) having a length of 10 microns, a width of 0.5 microns and spaced (gap SPC1) by 0.3 microns from the actuation element.

The curve CB2 corresponds to an arm BR1 (or BR2) of length 24 microns, of width 1 micron, still with a gap SPC1 of 0.3 microns.

Lastly, the curve CB3 corresponds to an arm BR1 (or BR2) of 24 microns in length, of width 0.5 microns and again spaced by 0.3 microns from the corresponding actuation element ELCT.

It can then be seen, on the curve CB1, that a voltage of around 11 volts needs to be applied to the actuation element in order to obtain the contact between the arm and the end-stop, in other words to fill the gap ESP1.

With a structure corresponding to the curve CB2, this voltage can be reduced to around 6 volts.

On the other hand, with a structure corresponding to the curve CB3, the contact is obtained with a voltage of around 4 volts, which is for example lower than the supply voltage (5 volts) used in a 130 nanometer technology.

Thus, in such a technology, it is not necessary to provide, for such an arm structure, for example a switched-mode power supply, so as to raise the actuation voltage above the supply voltage.

Thus, by way of example, it is possible to fabricate a capacitive cell with a surface area of 25 $\mu m^2$, using silicon nitride as dielectric with a thickness of 320 Å, having a capacitive value capable of being switched between 5 fF and 50 fF in around 1 microsecond with a 0-5 V control voltage.

Figure 11:
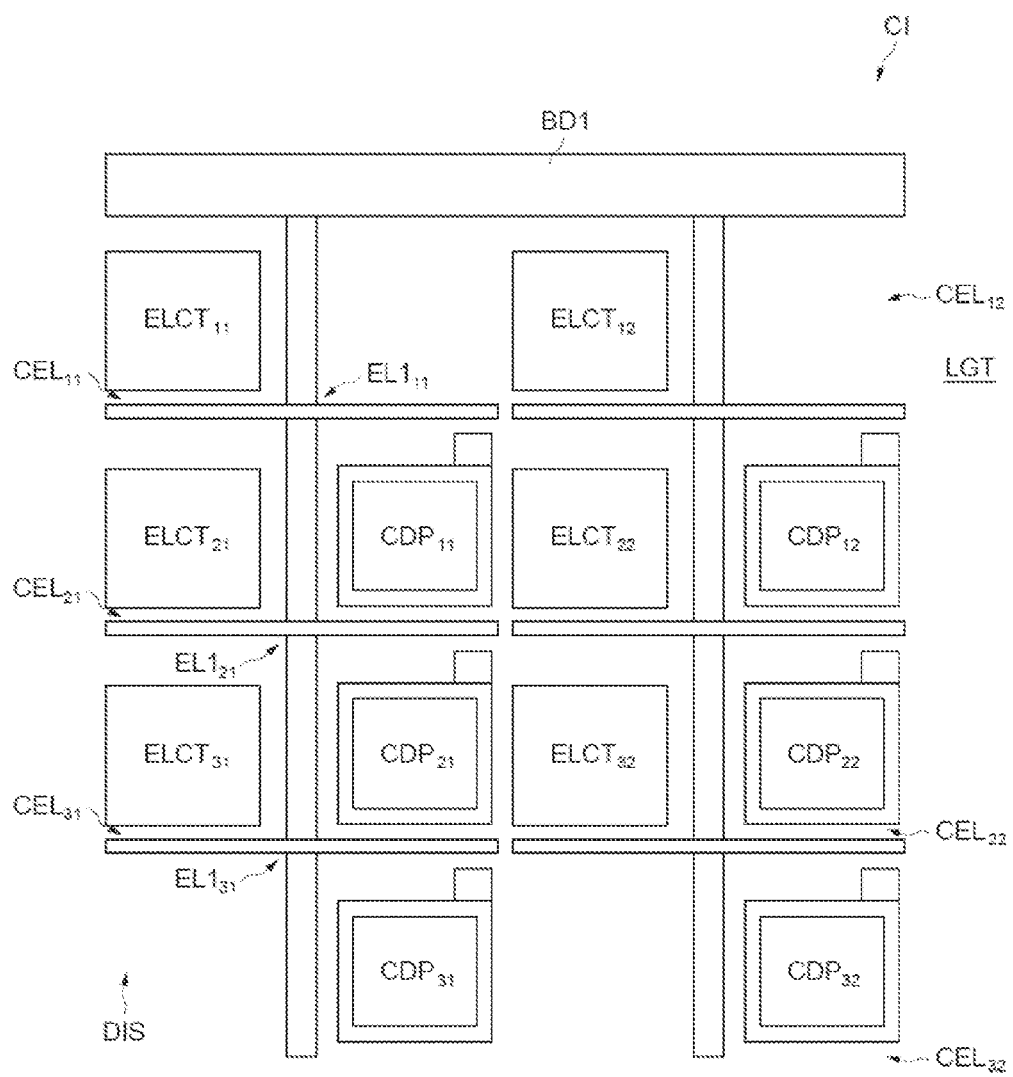

The switchable capacitive device can comprise, as illustrated in FIG. 11, several capacitive cells, for example disposed in a matrix, each being associated with one or more actuation elements. Furthermore, the metal systems (first and second elements of these cells) are individually switchable by means of their respective actuation element(s). This allows the capacitive device to be switched into various configurations in such a manner as to obtain a broad set of different and predetermined capacitive values.

In FIG. 11, the cells CELij are all accommodated within the accommodation LGT and are of the type that has been described with reference to FIG. 7.

Figure 12:
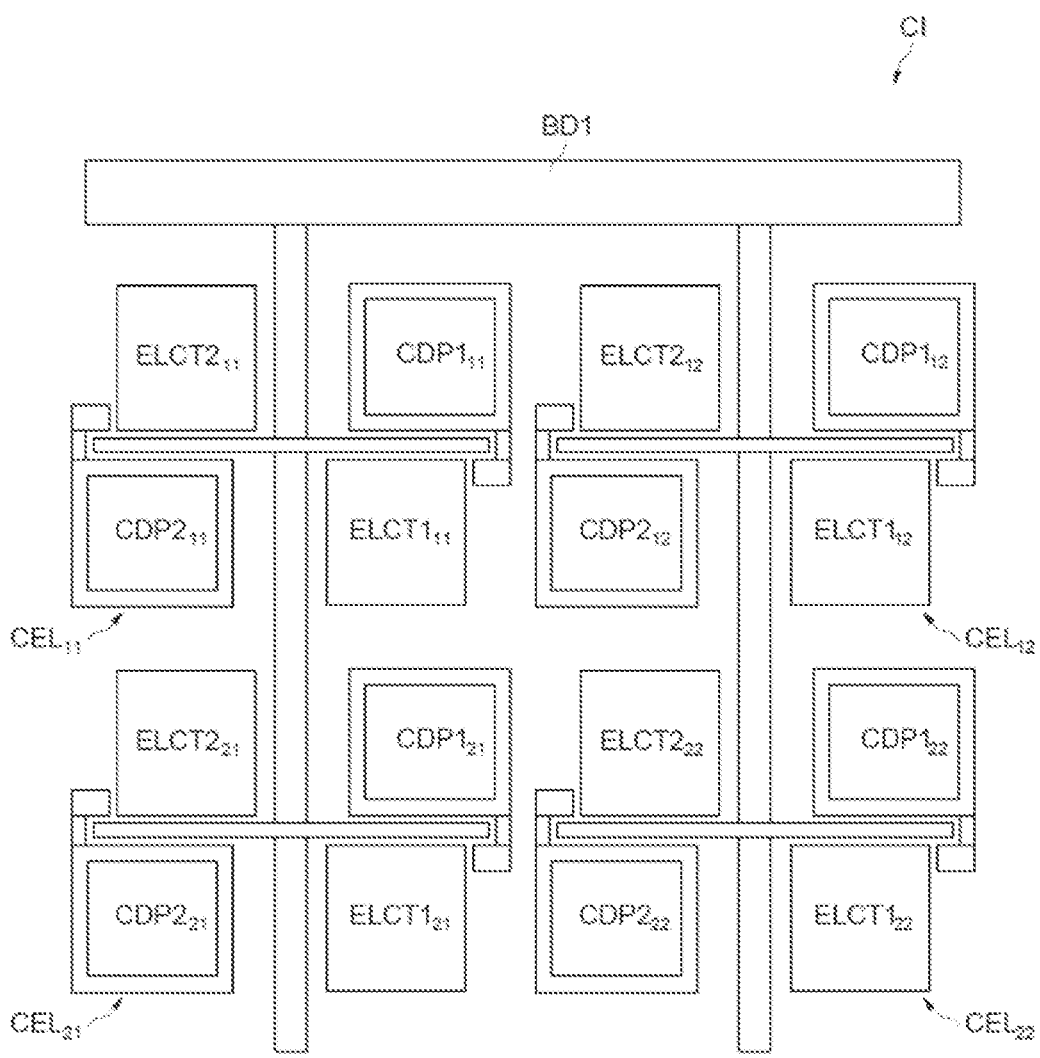

In FIG. 12, the cells CELij, also all accommodated within the accommodation LGT, are of the type of those described with reference to FIG. 8 or to FIG. 9.

Figure 13:
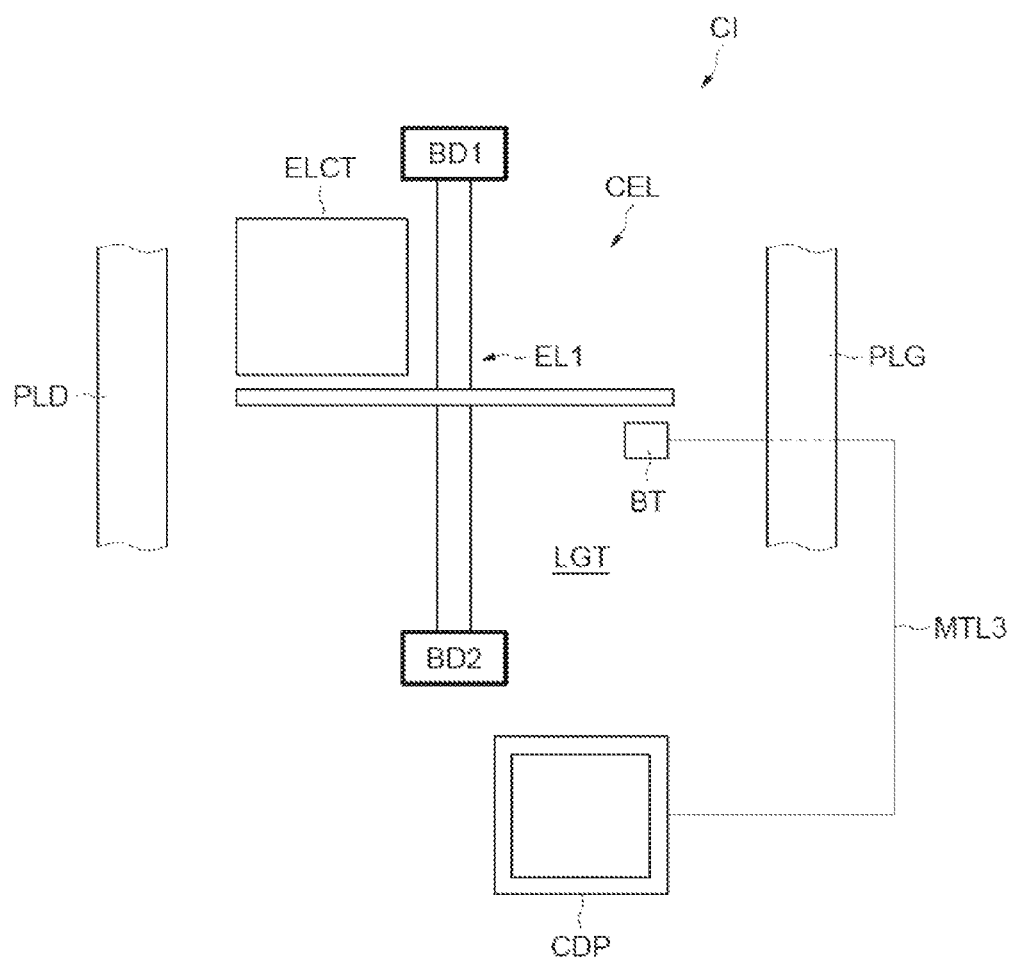

Whereas in the embodiments which have just been described the main capacitor CDP of the cell was also accommodated within the accommodation LGT, it is perfectly possible, as illustrated schematically in FIG. 13, for the main capacitor CDP to be located outside of the accommodation LGT, preferably within the interconnection part (BEOL) of the circuit. However, the main capacitor could also potentially be fabricated within the substrate of the integrated circuit. Nevertheless, irrespective of the location of the main capacitor CDP within the integrated circuit, it is connected to the fixed body BT of the metal system of the cell CEL by an electrical connection, typically a metallization MTL3 passing through a wall of the accommodation, for example the wall PLG, through an opening formed in the latter.

In the example described here, the first metal element EL1 has the shape of a cross with a single actuation element ELCP. However, this part of the cell CEL disposed within the accommodation LGT could be structurally identical to some of the embodiments that have previously been described for capacitors disposed within the accommodation LGT.

Figure 14:
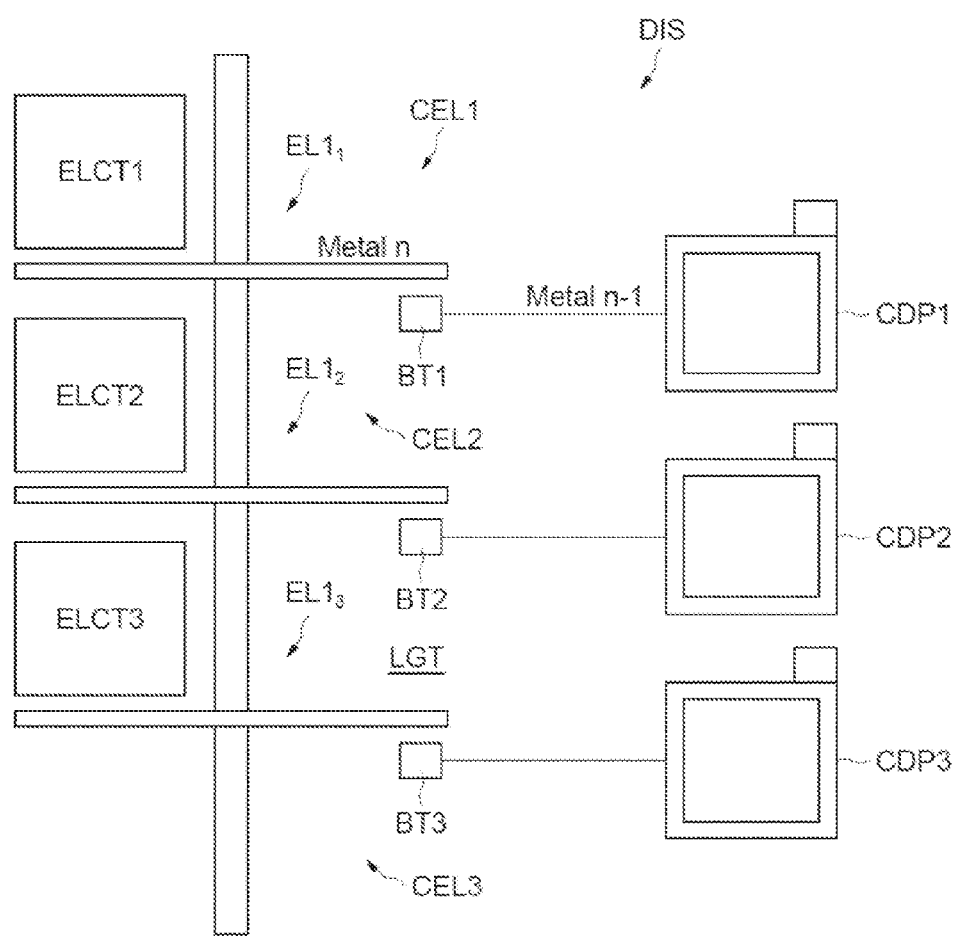

Furthermore, as illustrated in FIG. 14, even with capacitors CDP disposed outside of the accommodation, it is possible to provide a switchable capacitive device DIS comprising several capacitive cells having their metal system individually switchable by means of their actuation element ELCTi. Furthermore, the fixed bodies BTi of these cells can be connected via metallizations situated at the metal level n−1 to the main capacitors CDPi, whereas the first metal elements EL1$i$ of these cells are formed at the metal level n.

The accommodation LGT comprising the various walls and covers, the switchable device DIS and the plate PLQ are formed simultaneously and progressively along with the fabrication of the various metallization and via levels of the interconnection part RITX. The capacitors are, for their part, formed, as far as their upper electrode is concerned, between two metallization levels.

The steps for fabrication of the metallization and via levels and of electrodes are conventional steps that may notably be found in the standard fabrication process lines of CMOS technologies.

More precisely, after formation of a metal level i−1 and of the via level i−1, the various metal portions of the metal level i are formed in a conventional manner by etching of the underlying oxide RIS and metal deposition, for example of copper, in the trenches.

Then, the whole assembly is covered with oxide and the metallization level i+1, together with the via levels i, are subsequently formed.

This process is repeated as many times as is necessary to form the successive metallization and via levels.

Figure 15:
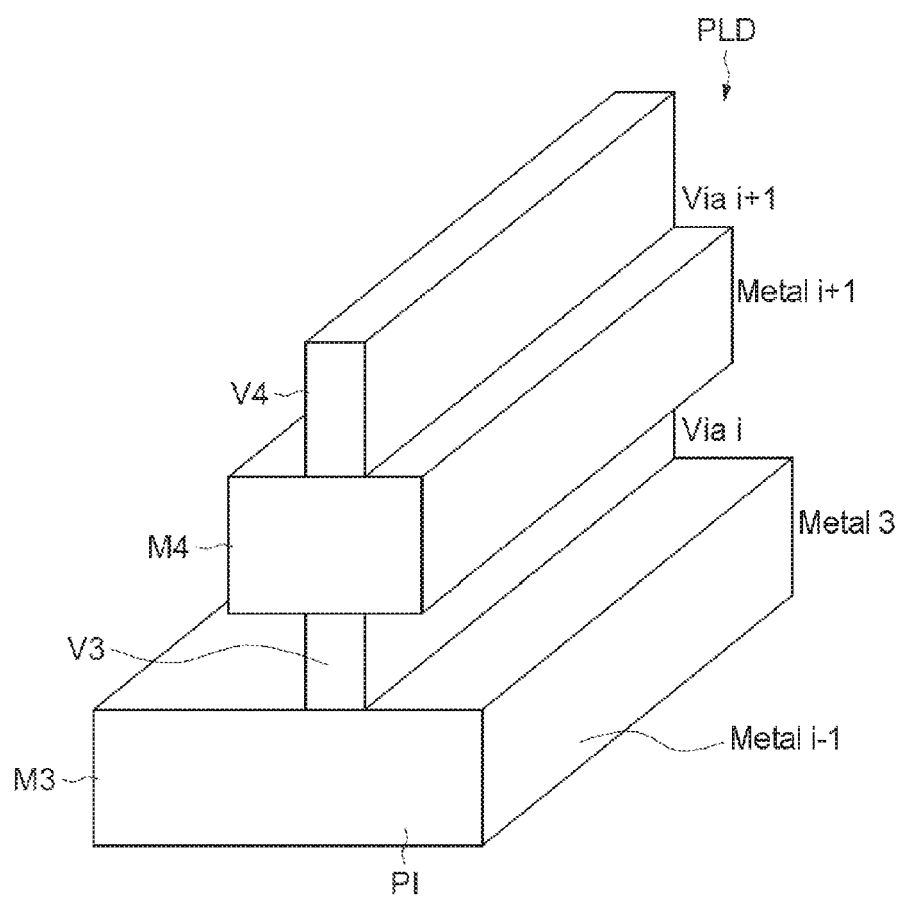

This is illustrated very schematically in FIG. 15 with regard to the construction of the wall PLD for example.

Figure 16:
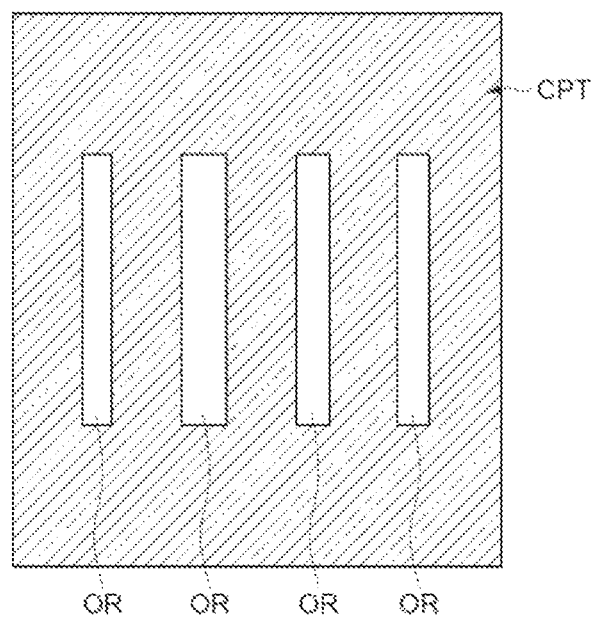

As previously indicated, the accommodation LGT is closed by the cover with holes CPT comprising (FIGS. 1 and 16) several orifices OR. Here, the cover CPT is formed at the metal level M6.

As will be seen in more detail hereinafter, in a first phase, the device DIS is encapsulated in the insulating material RIS of the interconnection part RITX, then liberated in a second phase, following etching away of this material RIS from the cavity of the accommodation.

Furthermore, as previously indicated, the metallization MTL1 (FIG. 1) passes through the opening OUV1 of the wall PLG and comes into contact with an element of the device DIS, in this case the upper electrode E2 of the main capacitor CDP.

Figure 17:
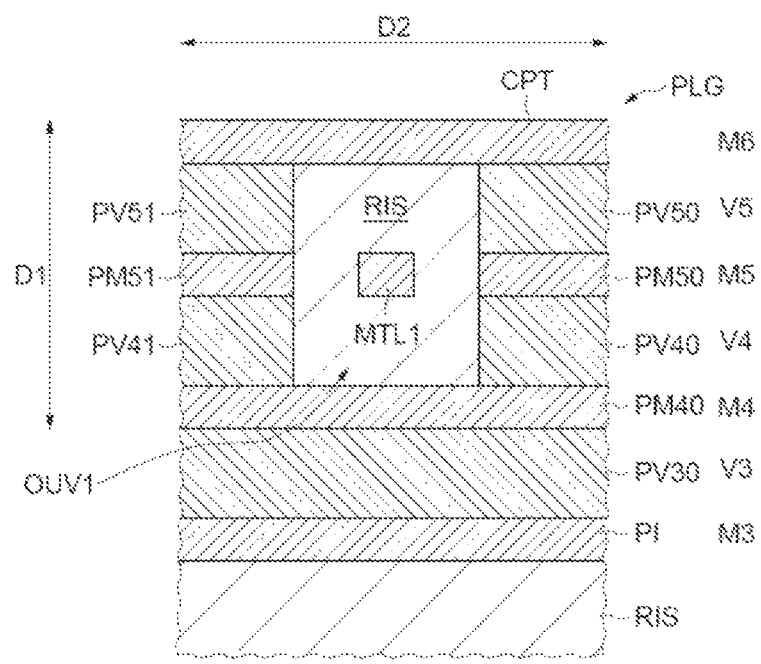

As illustrated in FIG. 17, which is a cross-sectional view, the wall PLG in which the opening OUV1 is formed extends, as does the wall PLD, over the metallization levels M3, M4, M5 and M6 and the via levels V3, V4 and V5.

The opening OUV1 is bounded in the direction D1 (vertical direction) by a first portion of the wall PLG situated in the upper metallization level, in this case a part of the cover CPT, and by a second portion of wall PM40 situated in the metallization level M4 connected to a portion of the bottom wall PI by a portion of via PV30.

The opening OUV1 is bounded in a second direction D2 perpendicular to the first direction (here the horizontal direction) by third and fourth portions of wall extending facing one another over the metallization level M5 and over the two via levels V4 and V5 framing this metallization level.

More precisely, the third portion of wall comprises a portion PV40 situated at the via level V4 underneath a portion of metal track PM50 underneath another portion PV50 situated at the via level V5.

Similarly, the fourth portion of wall comprises a portion PV41 situated at the via level V4 underneath another portion of metal track PM51 underneath a portion PV51 situated at the via level V5.

Furthermore, the through-metallization MTL1 runs at the metallization level M5 while being separated from the metal portions PM50 and PM51, in other words, being electrically insulated from the wall PLG.

By way of example, in the case of an accommodation LGT taking the form of a parallelepiped, the length of the accommodation, and the width, can be in the range between 10 and 100 microns, whereas the height, which of course depends on the number of metallization and via levels used to form the accommodation, can be in the range between 2 and 3.5 microns.

The height of the opening OUV1 may be in the range between 1 and 1.7 microns and the gap (counted in the direction D2) between the metallization MTL1 and each of the metal portions PM50 and PM51 (FIG. 17) is determined by the DRM (for Design Rules Manual) and can be in the range between 0.36 micron and 3 microns.

As previously indicated, the integrated circuit CI also comprises a metal plate PLQ (FIG. 1 and FIG. 18) rigidly attached to the metallization MTL1. This plate PLQ is disposed opposite the opening OUV1 and here consequently extends over the metallization levels M3, M4, M5, M6 and the via levels V3, V4 and V5. However, this plate could also spill over from the opening and consequently extend over additional metallization levels and additional via levels.

Figure 18:
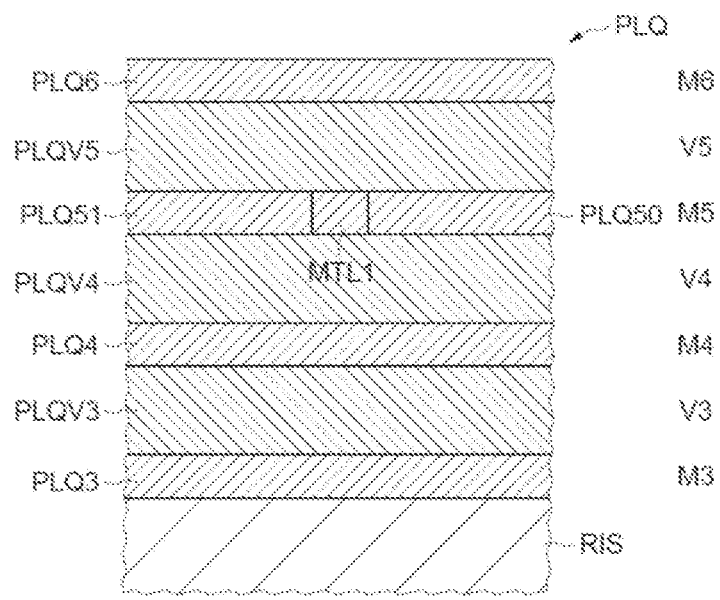

More precisely, as illustrated in FIG. 18 which is a cross section along the line V-V in FIG. 1, the plate PLQ comprises a lower metal portion PLQ3 formed at the metal level M3, a portion PLQV3 formed at the via level V3, a metal portion PLQ4 (metal level M4), a portion PLQV4 (via level V4), two metal portions PLQ50 and PLQ51, formed at the metallization level M5 and framing the metallization MTL1. In practice, the metallization MTL1 and the portions PLQ50 and PLQ51 form one and the same metal part.

The plate PLQ furthermore comprises a metal portion PLQV5 formed at the via level V5 and, finally, a metal portion PLQ6 formed at the metal level M6.

The plate PLQ is separated from the opening OUV1, so as not to short-circuit the metallization MTL1 with the bottom wall PI and the cover CPT.

By way of example, the thickness of the plate can vary between 0.2 and 1 micron. As regards the gap between the opening OUV1 and the plate, this can vary between 0.12 and 1 micron.

The external element that forms an obstacle to the diffusion of the fluid FL for de-encapsulation of the device DIS can have different structures.

Figure 20:
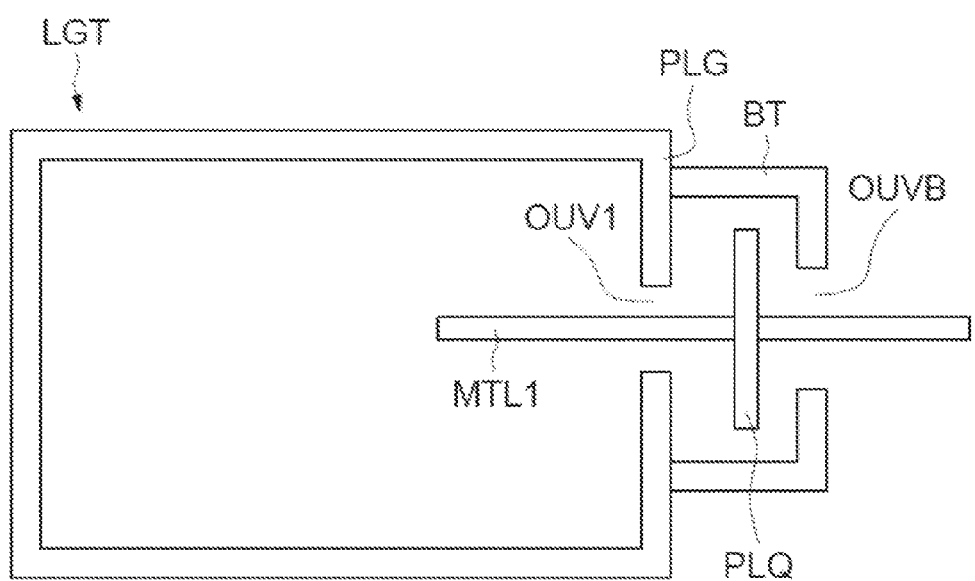

It is thus possible, as illustrated in FIG. 20, for the external element that forms an obstacle to the diffusion of the fluid to furthermore comprise an external metal box BT rigidly attached to the wall PLG. This box BT contains the plate PLQ and has a box opening OUVB. The plate PLQ is disposed between the wall opening OUV1 and the box opening OUVB and the metallization MTL1 passes through the box opening OUVB without making contact with the metal walls of the box BT so as, here again, to avoid an electrical short-circuit with the accommodation LGT.

Instead of being a plate, the external element may, as described in the French Patent Application no. 1350161, be a tunnel TN rigidly attached to the wall PLG around the opening OUV1.

Once the various elements of the device have been formed, an etching away of the insulating material RIS from the accommodation and a de-encapsulation of the device DIS and of the through-metallization MTL1 are carried out with a fluid penetrating into the accommodation via the orifices OR of the cover with holes CPT.

The fluid also propagates outside of the accommodation LGT via the opening OUV1 so as to etch away the insulating material RIS disposed between the wall PLG and the plate PLQ.

Figure 19:
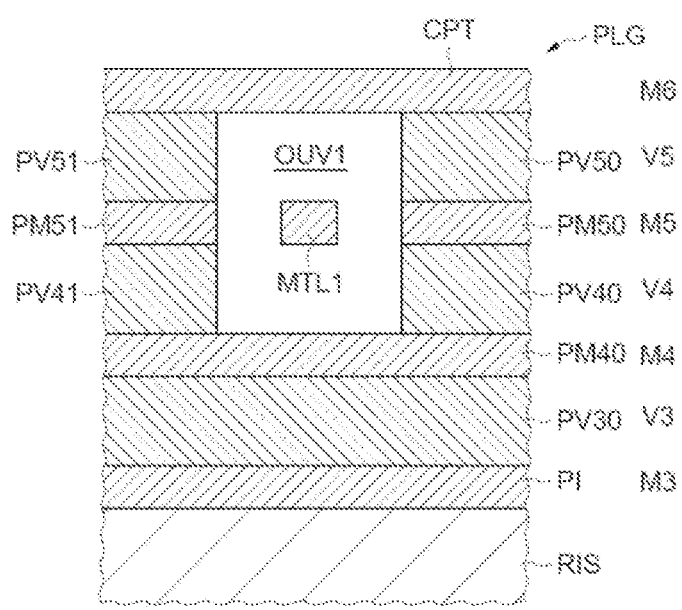

The through-metallization MTL1 then passes through the opening OUV1 (FIG. 19) while being at a distance from the edges of this opening OUV1 so as to avoid an electrical short-circuit with the wall PLG.

On the other hand, the diffusion of the fluid out of the accommodation via the opening OUV1 is blocked by the external element formed in this embodiment by the plate PLQ. This external element PLQ therefore forms an obstacle to the diffusion of the fluid out of the accommodation LGT through the opening OUV1 and hence limits the risk of a deterioration of the external environment of the accommodation LGT.

By way of example, the fluid may first of all be a plasma used in an isotropic dry etch operation, then for example hydrogen sulphide used in a wet etching.

After this operation for etching away of the insulating material RIS having enabled the de-encapsulation of the device DIS and in the present case the de-encapsulation of the arm which then becomes mobile within the accommodation, a conventional cleaning of the cavity of the accommodation is carried out, for example with an aqueous solution.

The dielectric material of the layer DL of the capacitor CDP can be the same material as the material RIS. Indeed, the gap between the two electrodes is sufficiently small for the dielectric material to subsist after de-encapsulation of the capacitor by the de-encapsulation fluid.

Figure 21:
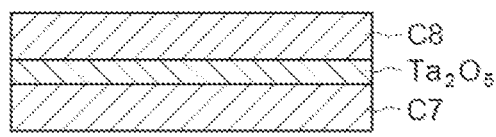

However, it is possible, as illustrated in FIGS. 21 to 24, to provide another dielectric material for the capacitor, for example $Ta_2O_5$. As illustrated in FIG. 21, the dielectric layer of $Ta_2O_5$ is first of all sandwiched between the two metal layers C7, C8 that will form the two electrodes of the capacitor CDP.

Figure 22:
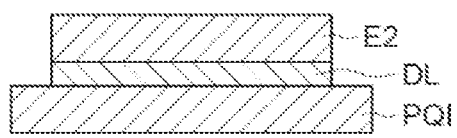
Figure 23:
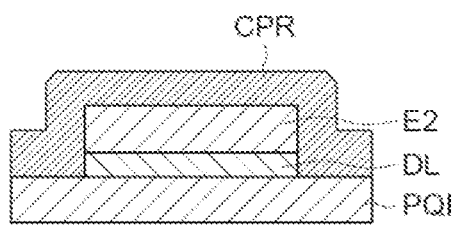
Figure 24:

Then, as illustrated in FIG. 22, the upper metal layer, the dielectric layer and the lower metal layer are etched in a conventional manner known per se, so as to form the upper electrode E2 and the dielectric layer DL lying on the lower plate PQI. Then, a protection layer CPR, for example of silicon nitride, is deposited onto the whole assembly (FIG. 23) which will in part be etched away during a plasma etch process while leaving behind lateral protections SPR (FIG. 24).

What is claimed is:

1. A method of forming an integrated circuit chip with a variable capacitor disposed in a metallization, the method comprising:
   providing a semiconductor substrate;
   forming back end of line metallization over the semiconductor substrate; and
   forming the variable capacitor within a cavity of the back end of line metallization, the variable capacitor comprising a fixed main capacitor electrode disposed in a first metal layer of the back end of line metallization, a second main capacitor electrode electrically connected to a second metal layer of the back end of line metallization and vertically spaced from the fixed main capacitor electrode, and a movable capacitor electrode disposed in the first metal layer adjacent the fixed main capacitor electrode.

2. The method according to claim 1, further comprising forming an actuation element in the back end of line metallization, the actuation element adjacent the movable capacitor electrode.

3. The method according to claim 1, wherein forming the variable capacitor within the cavity comprises:
   forming an enclosure from metal layers and via layers of the back end of line metallization, the enclosure including a plurality of orifices; and
   removing dielectric material from within the enclosure, the dielectric material removed by using an etchant introduced via the orifices.

4. The method according to claim 3, wherein at least one wall of the enclosure comprises an opening through which, at a distance from edges of the enclosure, a metal contact passes and comes into contact with a part of the variable capacitor within the enclosure, and wherein the integrated circuit chip further comprises an element external to the cavity configured so as to form an obstacle to diffusion of the etchant out of the cavity through the opening.

5. The method according to claim 1, further comprising forming a plurality of transistors in the semiconductor substrate prior to performing the back end of line metallization, wherein forming the back end of line metallization comprises connecting the transistors into a circuit.

6. A method of forming an integrated circuit, the method comprising:
   forming a plurality of transistors at an upper surface of a semiconductor substrate;
   forming a first metal layer over the semiconductor substrate, the first metal layer including a fixed main capacitor electrode and a movable capacitor electrode adjacent the fixed main capacitor electrode;
   forming a conductive region over the semiconductor substrate, the conductive region including a second main capacitor electrode vertically spaced from the fixed main capacitor electrode; and
   forming an actuator that is coupled to the movable capacitor electrode to cause the movable capacitor electrode to be in a first position electrically connected to the fixed main capacitor electrode or a second position spaced from the fixed main capacitor electrode.

7. The method of claim 6, wherein the movable capacitor electrode and at least a portion of the fixed main capacitor electrode are disposed within an air cavity within a housing, the method further comprising:
   forming a third metal layer between the semiconductor substrate and the first metal layer, the third metal layer forming a lower portion of the housing;
   forming a fourth metal layer over the first metal layer and the conductive region forming an upper portion of the housing; and
   forming a plurality of via regions between the third metal layer and the fourth metal layer, the via regions forming walls of the housing.

8. The method of claim 7, further comprising a forming a second metal layer between the third metal layer and the fourth metal layer, the second metal layer being electrically connected to the conductive region.

9. The method of claim 8, wherein:
the first metal layer vertically overlies the third metal layer;
the second metal layer vertically overlies the first metal layer;
the conductive region is vertically between the first metal layer and the second metal layer;
the fourth metal layer vertically overlies the second metal layer; and
the plurality of via regions comprises first via regions between the third metal layer and the first metal layer, second via regions between the first metal layer and the second metal layer, and third via regions between the second metal layer and the fourth metal layer.

10. The method according to claim 7, further comprising forming a fifth metal layer between the semiconductor substrate and the third metal layer.

11. The method according to claim 6, wherein the movable capacitor electrode comprises a first portion and a second portion that is wider than the first portion.

12. The method according to claim 6, wherein forming the actuator comprises forming an electrode disposed in the first metal layer.

13. The method according to claim 6, wherein the first metal layer also includes a first plurality of metal interconnects electrically connected to ones of the transistors.

14. The method according to claim 6, wherein the fixed main capacitor electrode and the second main capacitor electrode form a metal/dielectric/metal capacitor.

15. A method of forming an integrated circuit, the method comprising:
forming a plurality of transistors at an upper surface of a semiconductor substrate;
forming a first insulating layer over the semiconductor substrate;
forming a first metal layer over the first insulating layer, the first metal layer including a first plurality of interconnect regions and a lower portion of an enclosure;
forming a second insulating layer over the first metal layer;
forming a first plurality of via regions that include a first group formed at a peripheral region of the lower portion of the enclosure;
forming a second metal layer over the second insulating layer, the second metal layer including a second plurality of interconnect regions that are coupled to respective ones of the first plurality of interconnect regions by a second group of the via regions, a fixed main capacitor electrode, a movable capacitor electrode adjacent the fixed main capacitor electrode, and an actuator electrode adjacent the movable capacitor electrode;
forming a second capacitor electrode over the fixed main capacitor electrode and insulated therefrom by a dielectric region;
forming a third insulating layer over the second metal layer and the second capacitor electrode;
forming a second plurality of via regions that include a first group adjacent the first group of the first plurality of via regions;
forming a third metal layer over the third insulating layer, the third metal layer including a third plurality of interconnect regions that are coupled to respective ones of the second plurality of interconnect regions by a second group of the second plurality of via regions, and a capacitor interconnect line coupled to the second capacitor electrode;
forming a fourth insulating layer over the third metal layer;
forming a third plurality of via regions that include a first group adjacent the first group of the second plurality of via regions;
forming a fourth metal layer over the fourth insulating layer, the fourth metal layer including a fourth plurality of interconnect regions that are coupled to respective ones of the third plurality of interconnect regions by a second group of the third plurality of via regions, and an upper portion of the enclosure so that the enclosure comprises a floor formed from the lower portion of the enclosure, a plurality of walls formed by the first groups of the first, second, and third pluralities of via regions as well as portions of the second and third metal layers, and a top formed by the, the upper portion of the enclosure; and
removing portions of the second, third and fourth insulating layers within the enclosure so that at least the movable capacitor electrode is within a cavity.

16. The method of claim 15, wherein removing portions of the second, third and fourth insulating layers from within the enclosure by introducing and etchant through openings within the upper portion of the enclosure.

17. The method of claim 16, wherein the capacitor interconnect line extends through an opening in a wall of the enclosure.

18. The method of claim 17, further comprising forming an element external to the cavity configured so as to form an obstacle to diffusion of the etchant out of the cavity through the opening.

19. The method of claim 15, wherein the capacitor interconnect line extends through an opening in a wall of the enclosure.

20. The method of claim 15, further comprising forming a fifth metal layer between the semiconductor substrate and the first metal layer, the fifth metal layer including interconnect portions that are electrically coupled to regions of the semiconductor substrate through a plurality of plugs.

* * * * *